(12) United States Patent
Ishiwata

(10) Patent No.: US 6,661,045 B2
(45) Date of Patent: Dec. 9, 2003

(54) MOS TYPE SOLID-STATE IMAGER AND MANUFACTURING METHOD THEREOF

(75) Inventor: Hiroaki Ishiwata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/893,932

(22) Filed: Jun. 28, 2001

(65) Prior Publication Data
US 2002/0001039 A1 Jan. 3, 2002

(30) Foreign Application Priority Data
Jun. 28, 2000 (JP) ........................ 2000-195175

(51) Int. Cl.[7] ............................. H01L 31/062
(52) U.S. Cl. ............... 257/290; 257/222; 257/291
(58) Field of Search ................ 257/222, 225, 257/290, 291, 292

(56) References Cited

U.S. PATENT DOCUMENTS

| | | | | |
|---|---|---|---|---|
| 4,198,646 A | * | 4/1980 | Alexander et al. | 257/228 |
| 4,672,455 A | * | 6/1987 | Miyatake | 348/311 |
| 5,043,783 A | * | 8/1991 | Matsumoto et al. | 257/461 |
| 5,068,736 A | * | 11/1991 | Hamasaki | 348/296 |
| 5,070,380 A | * | 12/1991 | Erhardt et al. | 257/222 |
| 5,192,990 A | * | 3/1993 | Stevens | 257/229 |
| 5,306,931 A | * | 4/1994 | Stevens | 257/223 |
| 5,355,013 A | * | 10/1994 | Parker | 257/458 |
| 5,572,051 A | * | 11/1996 | Arakawa et al. | 257/225 |
| 5,675,158 A | * | 10/1997 | Lee | 257/233 |
| 5,869,853 A | * | 2/1999 | Yu | 257/222 |
| 6,184,055 B1 | * | 2/2001 | Yang et al. | 438/57 |
| 6,326,655 B1 | * | 12/2001 | Suzuki | 257/239 |
| 6,423,993 B1 | * | 7/2002 | Suzuki et al. | 257/292 |

FOREIGN PATENT DOCUMENTS

| | | | | |
|---|---|---|---|---|
| JP | 4-4-99381 | * | 3/1992 | 257/225 |
| JP | 7-14799 | | 1/1995 | |

OTHER PUBLICATIONS

U.S. patent application Ser. No. 09/537,745, Mori et al., filed Mar. 3, 2000.
U.S. patent application Ser. No. 09/606,178, Ishiwata et al., filed Jun. 29, 2000.
Inoue et al., "New LV–BPD (Low Voltage Buried Photo-Diode) for CMOS Imager," I.E.D.M. 1999.

* cited by examiner

*Primary Examiner*—George Eckert
(74) *Attorney, Agent, or Firm*—Frommer Lawrence & Haug LLP

(57) ABSTRACT

A photodiode and a read gate are formed within an element region. A $p^+$ type punch-through preventing region is not formed immediately under an n-type signal accumulating region of a photodiode. The n-type signal accumulating region is formed within a p-type semiconductor substrate. The $p^+$ type punch-through preventing region is formed over the entire element region. The $p^+$ type punch-through preventing region is also formed immediately under an insulative isolation layer in order to prevent punch-through between elements. A $p^+$ type punch-through stopper is formed immediately under an n-type first semiconductor region.

14 Claims, 6 Drawing Sheets

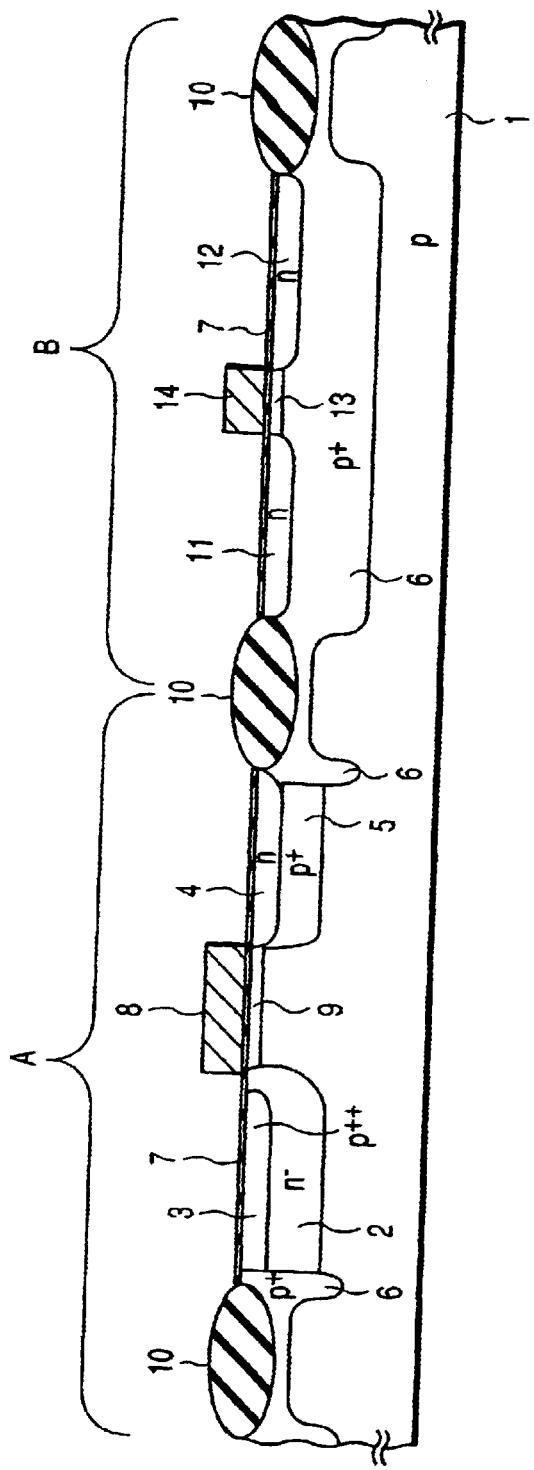
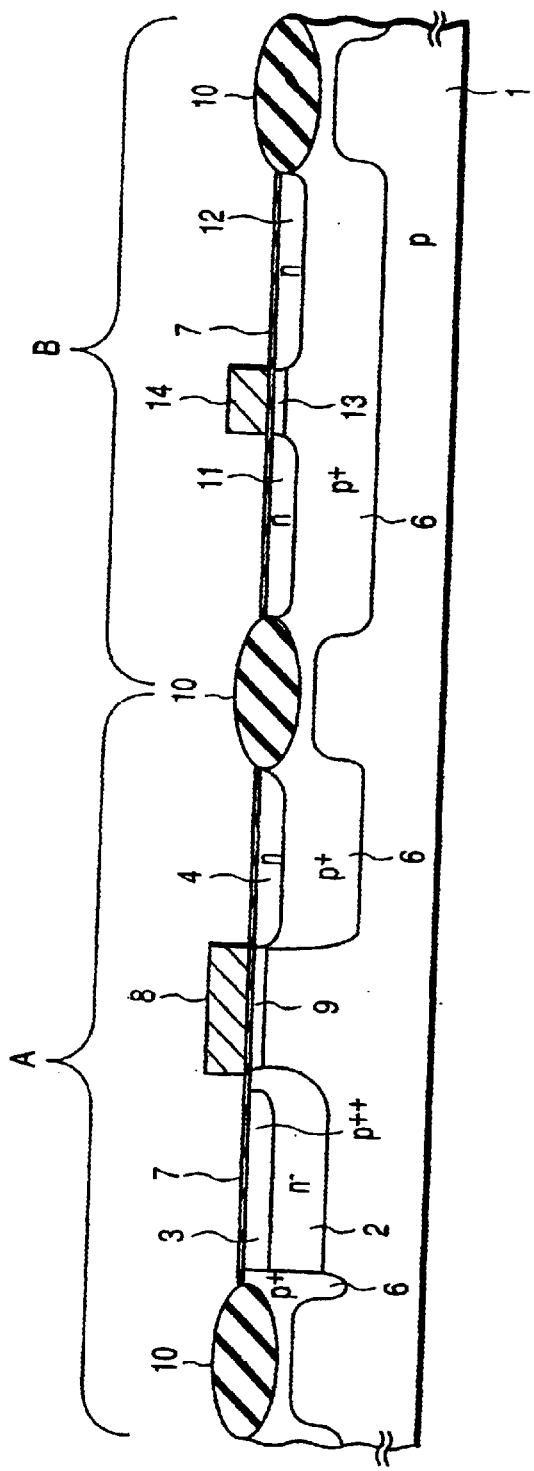
FIG. 2
FIG. 3

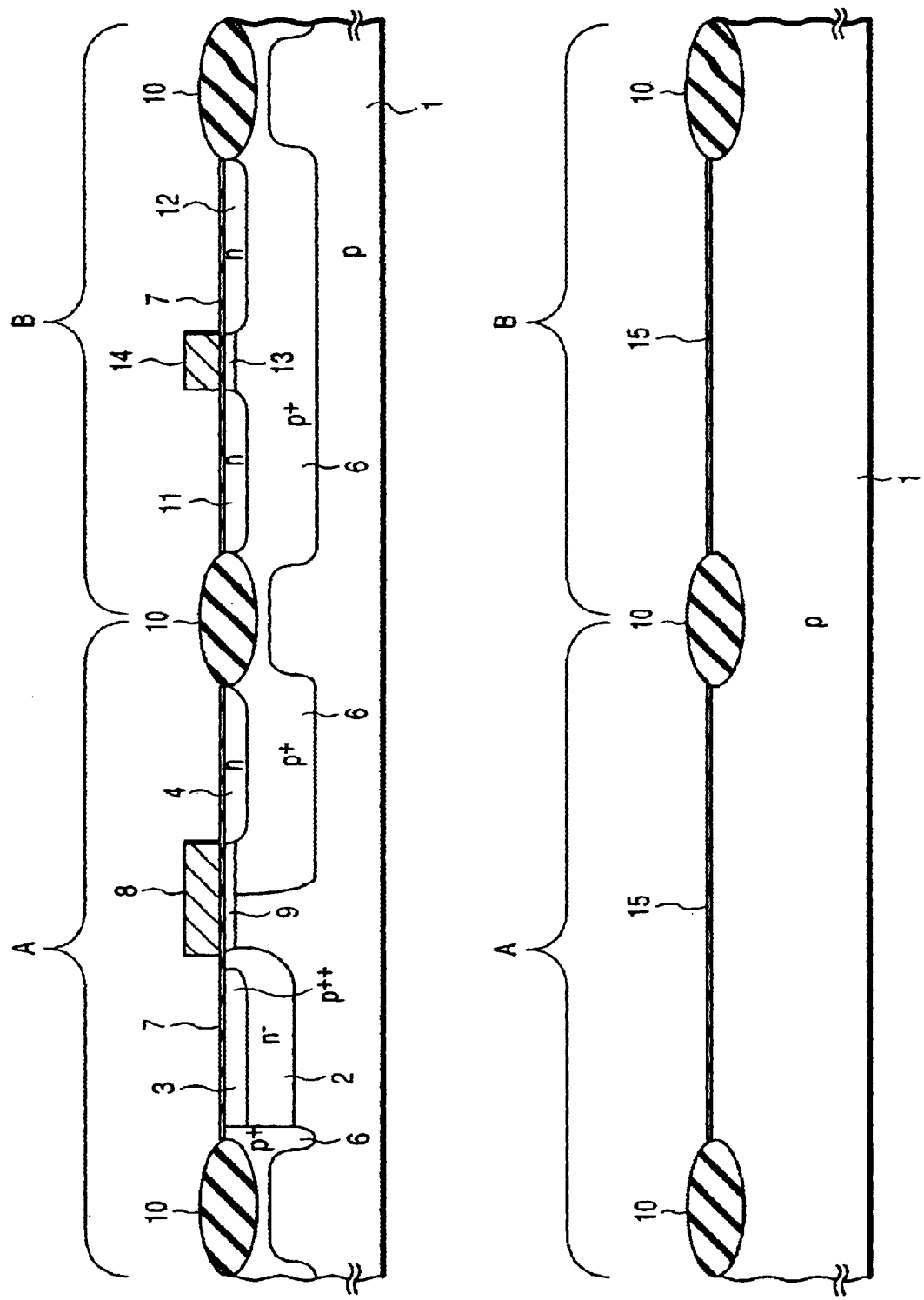

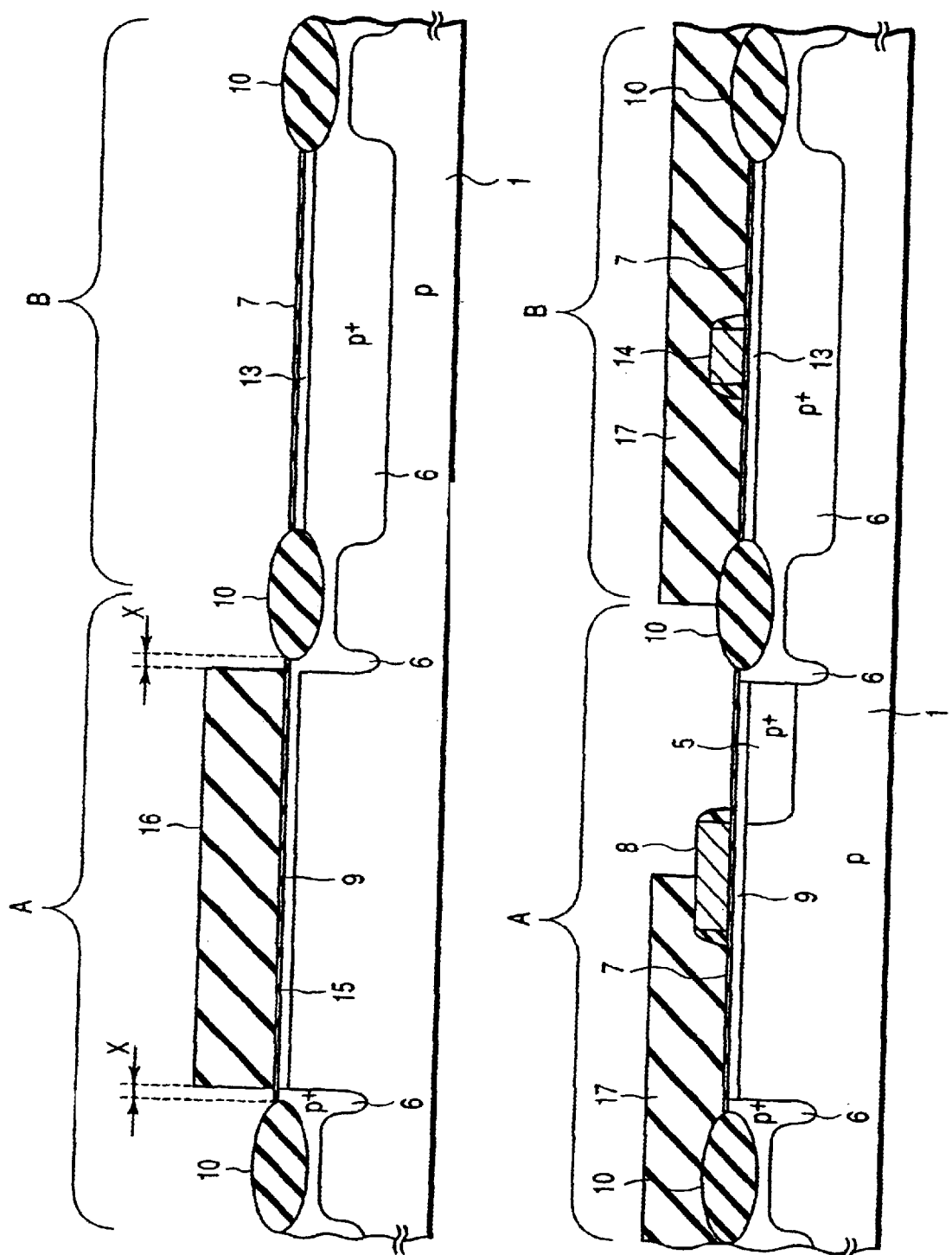

MOS TYPE SOLID-STATE IMAGER AND MANUFACTURING METHOD THEREOF

CROSS-REFERENCE TO RELATED APPLICATIONS

This application is based upon and claims the benefit of priority from the prior Japanese Patent Application No. 2000-195175, filed Jun. 28, 2000, the entire contents of which are incorporated herein by reference.

BACKGROUND OF THE INVENTION

1. Field of the Invention

The present invention relates to a structure of a device of a MOS type solid-state imager, and more specifically, to a MOS solid-state imager having a MOS transistor with a short gate length (channel length) and a thin gate oxide film, where the problem of punch-through is likely to occur.

2. Description of the Related Art

FIG. 1 is a picture element (pixel) of a conventional MOS type solid-state imager.

The picture element is constituted of a photodiode 21 for converting an optical signal to an electric signal (charge), a read gate (MOS transistor) 22 for transferring the charge converted by the photodiode 21 to a detecting section D (detecting node), a reset gate (MOS transistor) 23 for resetting the charge (potential) of the detecting section D, a sense gate (MOS transistor) 24 for amplifying the potential of the detecting section D, and a select gate (MOS transistor) 25 for outputting the potential of the picture element selected by an address signal.

The charge photoelectrically converted by the photodiode 21 and accumulated in a signal accumulation region per unit time is transferred to the detecting section D by way of the read gate 22, thereby changing the potential of the detection section D. The sense gate 24 amplifies the change in potential of the detection section D.

In a MOS-type solid-state imager, in order to completely transfer all the charge accumulated in the signal accumulating region of the photodiode 21 (photoelectric conversion section) to the detecting section D and further in order to stabilize the characteristics of the photodiode 21 within each of all picture elements, the impurity concentration of a semiconductor substrate (or a well region) is required to be set as low as possible.

However, if a MOS transistor is miniaturized to increase the number of picture elements (to increase the density of picture elements) in the case where the substrate contains impurities in a low amount, punch-through occurs. In other words, when the MOS transistor is reduced in size, the length of the gate (channel length) becomes shorter and the gate oxide film becomes thinner, as a natural consequence. As a result, "punch-through" occurs. "Punch through" is a phenomenon in which charges flow from the source to the drain of the MOS transistor even under the gate control.

When punch-through occurs, an unnecessary signal (unnecessary charge) flows through the MOS transistor, preventing the solid-state imager from operating normally.

Therefore, it is necessary to prevent the occurrence of punch-through. To prevent punch-through, a punch-through preventing region is provided inside a semiconductor substrate (at a position sufficiently deep from the surface) in conventional logic products.

The punch-through preventing region plays a role in preventing the leakage between the source and drain of the MOS transistor. When a MOS transistor having a p-type substrate and an n-type source/drain, a p-type punch-through preventing region is usually used. Such a punch-through preventing region is effective in the logic products. It efficiently prevents punch-through.

However, the MOS type solid-state imager has a problem. This is because a photodiode must be formed inside the semiconductor substrate at a position sufficiently deep from the surface. More specifically, a photodiode is usually formed of a p-type semiconductor substrate and an n-type signal accumulation region (impurity region. Therefore, the n-type signal accumulation region must be formed inside the semiconductor substrate at a position sufficiently deep from the surface.

In the case where the punch-through region is formed inside the semiconductor substrate, the conductive type (e.g. n-type) of an impurity (e.g., phosphorus) constituting the signal accumulation region is opposite to that (e.g. p-type) of an impurity (e.g., boron) constituting the punch-through preventing region. In addition, the signal accumulating region and the punch-through preventing region are formed at almost the same position sufficiently deep from the surface inside the semiconductor substrate, as mentioned above.

In the circumstances, if the punch-through preventing region is attempted to be formed in the MOS type solid-state imager, the punch through preventing region is first formed, and then, the signal accumulating region must be formed within the formed punch-through preventing region. To form the signal accumulating region, an impurity (n-type) must be doped in an amount sufficient to invert the conductive type (p-type) of the punch-through preventing region.

On the other hand, to completely read out all the charge photoelectrically converted and accumulated in the signal accumulation region of the photodiode, it is important to reduce the depletion potential of the photodiode as much as possible. To reduce the depletion potential, it is preferable that the signal accumulation region be stably formed with an impurity concentration as low as possible.

However, to form the signal accumulating region within the punch-through preventing region, an impurity (n-type) must be doped into the semiconductor substrate in an amount sufficient to invert the conductive type (e.g. p-type) of the punch-through preventing region. It is at least required that the concentration of the n-type impurity to be doped in the semiconductor substrate be higher than that of the p-type impurity of the punch-through preventing region.

In this case, the effect of the p-type impurity and that of the n-type impurity are considered to cancel each other out. Therefore, the impurity concentration of the signal accumulating region is given by the following equation:

Impurity concentration=dn−dp where dp is the concentration of the p-type impurity constructing the punch-through preventing region, and dn is the concentration of the n-type impurity ion-doped in the semiconductor substrate.

However, both impurity concentrations dn and dp are extremely large. When the large numerical value (dp) is subtracted from the large numerical value (dn) to give a small value, a small change in the large numerical values results in a big change in the small numerical value. For this reason, when the punch-through preventing region is formed in an MOS type solid-state imager, it is very difficult to stably form the signal accumulating region containing the small amount of impurities.

In other words, a small variation in the concentration of the n-type impurity to be ion-doped into the semiconductor substrate results in a large variation in the impurity concentration of the signal accumulating region. Accordingly, the deletion potential of the diode is greatly changed, with the result that the charge of the signal accumulation region cannot be stably read out.

As described in the foregoing, in the MOS type solid-stage imager, with an increase in the number of picture elements (an increase of picture elements in density), the gate length of a MOS transistor becomes shorter and the gate oxide film becomes thinner. Under the circumstance, the phenomenon of punch-through has become a significant problem. On the other hand, it is very difficult to simply apply a punch-through preventing region used in a logic product to the MOS type solid-state imager, due to the presence of the signal accumulation region in the photodiode.

To transfer the charge with certainty, it is preferable that both the impurity concentration of the signal accumulating region and the depletion potential of the photodiode be set low and stable. However, when the punch-through preventing region is formed, the signal accumulating region must be formed by inverting the conductive type of the punch-through preventing region. It is therefore impossible to stably form the signal accumulating region containing a low concentration of an impurity.

To summarize, as the MOS transistor is miniaturized in a conventional MOS type solid-state imager, the problem of punch-through occurs. In this case, if a punch-through preventing region is formed to prevent punch-through, it is difficult to stably maintain the depletion potential of the photodiode at a low level. As a result, a MOS type solid-state image having a uniform electron transfer ability cannot be stably manufactured.

BRIEF SUMMARY OF THE INVENTION

An object of the present invention is to provide an MOS type solid-state imager having a photodiode whose signal accumulating region is stably formed with a low impurity concentration and capable of preventing punch-through even if the MOS transistor is reduced in size, and a method of manufacturing the same.

The MOS type solid-state imager of the present invention comprises: a photoelectric conversion element formed in a semiconductor substrate of a first conductive type; a first MOS transistor of a second conductive type formed in a first element region of the semiconductor substrate, for reading out a charge generated by the photoelectric conversion element; a second MOS transistor of the second conductive type formed in a second element region of the semiconductor substrate; and a punch-though preventing region of the first conductive type formed over the second element region, for preventing punch-through.

The method of manufacturing a MOS type solid-state imager of the present invention comprises the steps of:

forming an insulative isolation layer on a semiconductor substrate of a first conductive type, thereby forming first and second element regions surrounded by the insulative isolation layer;

doping an impurity of the first conductive type in the semiconductor substrate by an ion implantation method, thereby forming a punch-through preventing region of the first conductive type at least immediately under the insulative isolation layer and over the second element region, to prevent punch-through;

forming a photoelectric conversion element and a first MOS transistor in the first element region, for reading out charge generated by the photoelectric conversion element and the photoelectric conversion element, and simultaneously forming a second MOS transistor in the second element region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view showing a MOS type solid-state image according to a first embodiment of the present invention;

FIG. 3 is a cross-sectional view showing a MOS type solid-state image according to a second embodiment of the present invention;

FIG. 4 is a cross-sectional view showing a MOS type solid-state image according to a third embodiment of the present invention;

FIG. 5 is a cross-sectional view showing a step of a method of manufacturing a MOS type solid-state imager of the present invention;

FIG. 6 is a cross-sectional view showing a step of a method of manufacturing a MOS type solid-state imager of the present invention;

FIG. 7 is a cross-sectional view showing a step of a method of manufacturing a MOS type solid-state imager of the present invention;

DETAILED DESCRIPTION OF THE INVENTION

A MOS type solid-state imager of the present invention will be described below in detail with reference to the accompanying drawing.

Embodiment 1

FIG. 2 is an embodiment of a MOS type solid-state imager of the present invention.

A p-type semiconductor substrate 1 contains an impurity at a concentration as low as $1 \times 10^{15}$ atoms/cm$^3$. The semiconductor substrate 1 serves as an anode of a photodiode and set at, for example, a ground potential. In the case where a p-type well region is formed in the semiconductor substrate 1, the p-type well region may be used as the anode of the photodiode. In this case, the impurity concentration of the p-type well region is set at, for example, $1\times10^{15}$ atoms/cm$^3$.

On the semiconductor substrate 1, an insulative isolation layer 10 is formed for electrically isolating elements from each other. In this embodiment, the insulative isolation layer 10 is a field oxide film formed by, for example, a LOCOS (Local Oxidation of Silicon) method. Alternatively, an oxide film formed by a STI (Shallow Trench Isolation) method may be used in place of the field oxide.

Figure 1:
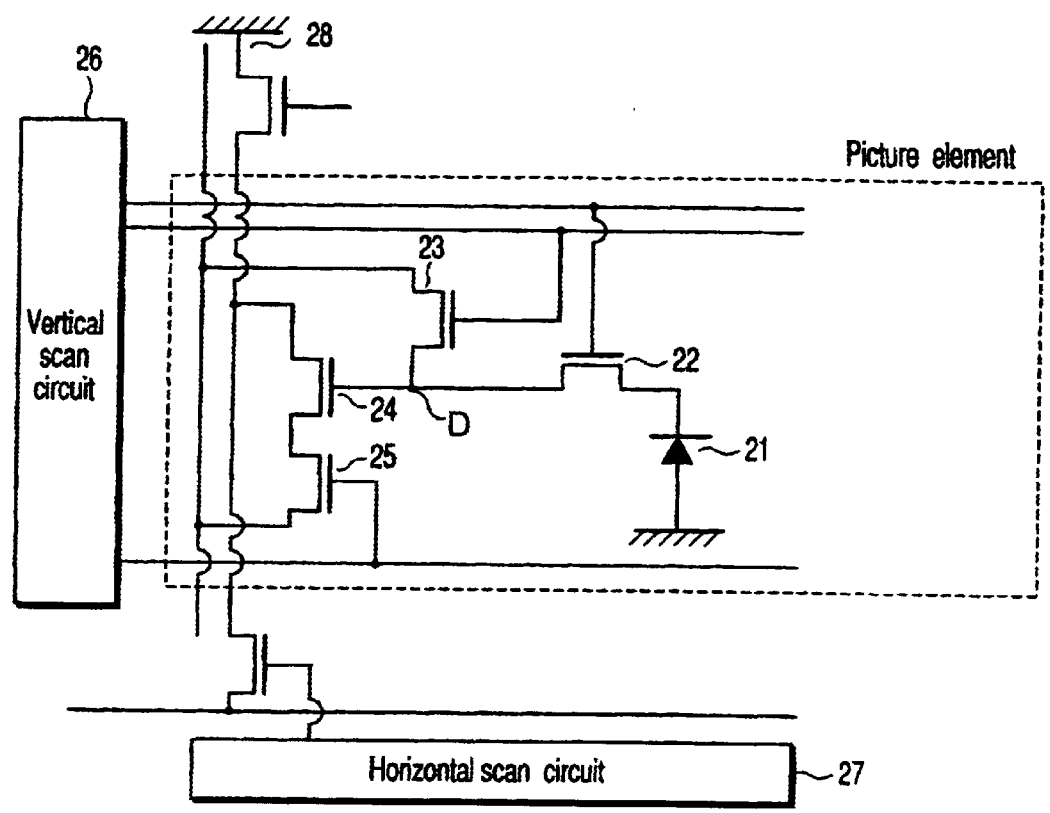
FIG. 1 is a circuit diagram showing a picture element of a conventional MOS type solid-state imager.

In an element region A surrounded by the insulative isolation layer 10, a photodiode 21 and a read gate 22 (shown in FIG. 1) are to be formed. In an element region B surrounded by the insulative isolation layer 10, elements such as a reset gate 23, a sense gate 24, a select gate 25 (shown in FIG. 1) except the photodiode 21 and read gate 22, are to be formed.

In the element region A, an n-type signal accumulating region 2 is formed inside the semiconductor substrate 1 (at a position sufficiently deep from the surface). In this embodiment, the n-type signal accumulating region 2 is not formed within a p$^+$ type punch-through preventing region 6 but directly formed within the semiconductor substrate 1. Within the n-type signal accumulating region 2, a P$^{++}$ type surface shield layer 3 is formed.

Furthermore, in the element region A, a p$^+$-type punch-through stopper 5 is formed at a portion inside the semiconductor substrate 1 and different from the portion in which the n-type signal accumulating region 2 is formed. Within the p$^+$ type punch-through stopper 5, an n-type first semiconductor region 4 is formed.

On the p-type read out channel region 9 between the n-type signal accumulating region 2 and the n-type first semiconductor region 4, a read gate electrode 8 is formed via a gate oxide film 7 formed of SiO$_2$. The read gate electrode 8 is formed of, for example, a conductive polysilicon film containing an n-type impurity and serves as a gate electrode of the read gate (MOS transistor) 22 of FIG. 1.

In the element region B, the p$^+$ type punch-through preventing region 6 is formed inside the semiconductor substrate 1 (at a position sufficiently deep from the surface) to prevent punch-through. The p$^+$-type punch-through preventing region 6 is formed over the entire element region B. Within the p$^+$-type punch-through preventing region 6, an n-type second semiconductor region 11 and an n-type third semiconductor region 12 are formed.

On the p-type channel region 13 between the n-type second semiconductor region 11 and the n-type third semiconductor region 12, a gate electrode 14 is formed via a gate oxide film 7 formed of SiO$_2$. The gate electrode 14 is formed of a conductive polysilicon film containing, for example, an n-type impurity. The gate electrode 14 serves as a gate electrode of a MOS transistor, such as the reset gate 23, the sense gate 24, or the select gate 25 shown in FIG. 1

A first feature of the device structure of the MOS type solid-state imager resides in that the p$^+$ type punch-through preventing region 6 is not formed immediately under the n-type signal accumulating region 2. To be more specific, in the present invention, the n-type signal accumulating region 2 is directly formed inside the semiconductor substrate 1 and not formed within the p$^+$ type punch-through preventing region 6. With this structure, the n-type signal accumulating region 2 having a low impurity concentration can be stably formed.

To explain more specifically, the impurity (e.g. boron) concentration of the semiconductor substrate 1 is set at, for example, $1\times10^{15}$ atoms/cm$^3$, as mentioned above, and the impurity concentration (e.g., boron) of the p$^+$ type punch-through preventing region 6 is set at, for example, $1\times10^{17}$ atoms/cm$^2$.

In brief, in the present invention, the n-type signal accumulating region 2 is formed inside the semiconductor substrate 1 containing an impurity at a concentration lower than that of the p$^+$ type punch-through preventing region 6, by a factor of $10^2$. When impurity ions (n-type impurity) are implanted for forming the n-type signal accumulating region 2, the dose of the n-type impurity can be set low. As a result, the n-type signal accumulating region 2 having a low impurity concentration can be stably formed.

A second feature resides in that the p$^+$ type punch-through preventing region 6 is formed immediately under the insulative isolation layer 10 and over the entire element region B. In the element region A, the p$^+$-type punch-through stopper 5 is formed only immediately under the n-type first semiconductor region 4. In other words, the n-type first semiconductor region 4 serves as a detecting section (detection node) D shown in FIG. 1. Therefore, its impurity concentration is not required to be set as low as that of the n-type signal accumulating region 2.

Accordingly, it is necessary to form the p$^+$-type punch-through stopper 5 immediately under the n-type first semiconductor region 4, thereby preventing punch-through generated between the n-type first semiconductor region 4 and another n-type semiconductor region.

Note that the p$^+$ type punch-through preventing region 6 must be formed immediately under the insulative isolation layer 10 without fail to efficiently prevent punch-through between two n-type semiconductor regions sandwiching the insulative isolation layer 10.

The p$^+$-type punch-through preventing region 6 is formed by implanting impurity ions at a predetermined dose while applying a predetermined acceleration energy after the insulative isolation layer 10 is formed and before the gate electrodes 8 and 14 are formed. At that time, if impurity ions are doped under such a condition that an impurity (e.g., boron) penetrates through the insulative isolation layer 10, the impurity ions reach a portion deep within the semiconductor substrate 1 of the element region B having no insulative isolation layer 10, as shown in FIG. 2. As a result, the p$^+$ type punch-through preventing region 6 is formed at a position sufficiently deep from the surface of the semiconductor substrate 1.

In FIG. 2, the thickness of the gate oxide film 7 is set at about 8 nm and the gate length (channel length) of the gate electrode 14 is set at about 0.4 μm. The impurity concentration of the p$^{++}$ type surface shield layer 3 is set at about $1\times10^{18}$ atoms/cm$^3$, whereas the impurity concentrations of both the p$^+$ type punch-through stopper 5 and p$^+$-type punch-through preventing region 6 are set at about $1\times10^{17}$ atoms/cm$^3$.

As explained above, according to a first embodiment of the MOS type solid-state imager of the present invention, it is possible to stably form the photodiode signal accumulating region having a low impurity concentration. In addition, even if the MOS transistor is miniaturized, punch-through can be prevented.

Embodiment 2

The MOS type solid-state imager of the present invention has a feature in the p$^+$ type punch-through preventing region 6.

In the first embodiment mentioned above, a photodiode is formed at a source side of the read gate (an MOS transistor of element region A), whereas the n-type first semiconductor region 4 serving as the detecting section (detection node) D is formed at a drain side. The p$^+$ type punch-through stopper 5 is formed immediately under the n-type first semiconductor region 4, discretely from the p$^+$ punch-through preventing region 6.

However, the p+ type punch-through stopper 5 and p+ type punch-through preventing region 6 are formed for the same purpose (for preventing punch-through) and having the same impurity concentration. For this reason, it is clear that the p+-type punch-through preventing region 6 may be formed immediately under the n-type first semiconductor region 4 in place of the p+-type punch-through stopper 5.

In this embodiment, the p+ type punch-through preventing region 6 is also formed immediately under the n-type semiconductor region 4. As a result, the step of forming the p+ type punch-through stopper 5 is not required in this embodiment. Hence, due to this, the imager can be manufactured in fewer steps.

Now, a second embodiment of the MOS-type solid-state imager will be explained.

FIG. 3 shows a second embodiment of the MOS type solid-stage image of the present invention.

A p-type semiconductor substrate 1 has an impurity at a concentration as low as $1\times10^{15}$ atoms/cm$^3$. The semiconductor substrate 1 serves as an anode of the photodiode and set at a ground potential. Note that the semiconductor substrate 1 has a p-type well region within the substrate. The p-type well region may be used as the anode of the photodiode. In this case, the impurity concentration of the p-type well is set at, for example, $1\times10^{15}$ atoms/cm$^3$.

On the semiconductor substrate 1, an insulative isolation layer 10 is formed for electrically isolating elements from each other. In this embodiment, the insulative isolation layer 10 is a field oxide film formed by a LOCOS (Local Oxidation of Silicon) method. Alternatively, an oxide film formed by, for example, a STI method may be used in place of the field oxide film.

An element region A surrounded by the insulative isolation layer 10 is the region in which the photodiode 21 and the read gate 22 (shown in FIG. 1) are to be formed. Furthermore, in an element region B surrounded by the insulative isolation layer 10, elements such as the reset gate 23, the sense gate 24, the select gate 25 (shown in FIG. 1) except the photodiode 21 and read gate 22, are to be formed.

In the element region A, an n-type signal accumulating region 2 is formed inside the semiconductor substrate 1 (at a position sufficiently deep from the surface). In this embodiment, the n-type signal accumulating region 2 is not formed within a p+type punch-through preventing region 6 but directly formed within the semiconductor substrate 1. Within the n-type signal accumulating region 2, a P++ type surface shield layer 3 is formed.

Furthermore, in the element region A, the p+ type punch-through preventing region 6 is formed inside the semiconductor substrate 1 at a portion sufficiently deep from the surface and different from the portion where the n-type signal accumulating region 2 is formed. Within the p+ type punch-through preventing region 6, an n-type first semiconductor region 4 is formed.

On the p-type read out channel region 9 between the n-type signal accumulating region 2 and the n-type first semiconductor region 4, a read gate electrode 8 is formed via a gate oxide film 7 formed of SiO$_2$. The read gate electrode 8 is formed of, for example, a conductive polysilicon film containing an n-type impurity and serves as a gate electrode of the read gate (MOS transistor) 22 of FIG. 1.

In the element region B, the p+ type punch-through preventing region 6 is formed inside the semiconductor substrate 1 (at a position sufficiently deep from the surface) to prevent punch-through. The p+ type punch-through preventing region 6 is formed over the entire element region B. Within the p+ type punch-through preventing region 6, an n-type second semiconductor region 11 and an n-type third semiconductor region 12 are formed.

On the p-type channel region 13 between the n-type second semiconductor region 11 and the third semiconductor region 12, a gate electrode 14 is formed via the gate oxide film 7 formed of SiO$_2$. The gate electrode 14 is formed of a conductive polysilicon film containing, for example, an n-type impurity. The gate electrode 14 serves as a gate electrode of an MOS transistor such as the rest gate 23, the sense gate 24, and the select gate 25 shown in FIG. 1.

Like the first example, also in the device of the MOS type solid-state imager of this embodiment, the p+ type punch-through preventing region 6 is not formed immediately under the n− signal accumulating region 2. More specifically, in the present invention, the n-type signal accumulating region 2 is directly formed inside the semiconductor substrate 1 and not formed within the p+ type punch-through preventing region 6. Therefore, the n-type signal accumulating region 2 having a low impurity concentration can be stably formed.

More specifically, the impurity (e.g., boron) concentration of the semiconductor substrate 1 is set at $1\times10^{15}$ atoms/cm$^3$, as mentioned above. The impurity (boron) concentration of the p+ type punch-through preventing region 6 is set at $1\times10^{17}$ atoms/cm$^3$.

In the present invention, the n-type signal accumulating region 2 is formed within the semiconductor substrate 1 containing an impurity at a concentration lower than that of the p+ type punch-through preventing region 6 by a factor of $10^2$. When ions are implanted to form the n-type signal accumulating region 2, it is possible to set the dose of the n-type impurity at a low value. As a result, the n-type signal accumulating region 2 having a low impurity concentration can be stably formed.

Note that it is necessary to form the p+-type punch-through preventing region 6 immediately under the insulative isolation layer 10, with certainty, in order to efficiently prevent punch-through between two n-type signal accumulating regions 2 sandwiching the insulative isolation layer 10.

The p+ type punch-through preventing region 6 is formed by implanting impurity ions at a predetermined dose while applying a predetermined acceleration energy after the insulative isolation layer 10 is formed before the gate electrodes 8 and 14 are formed. At that time, if impurity ions are doped under such a condition that the impurity ions (e.g., boron) penetrate through the insulative isolation layer 10, the impurity ions reach a portion deep within the semiconductor substrate 1 of the element region having no insulative isolation layer 10, as shown in FIG. 3. As a result, the p+ type punch-through preventing region 6 is formed at a position sufficiently deep from the surface of the semiconductor substrate 1.

In FIG. 3, the thickness of the gate oxide film 7 is set at about 8 nm and the gate length (channel length) of the gate electrode 14 is set at about 0.4 μm. The impurity concentration of the p++ type surface shield layer 3 is set at about $1\times10^{18}$ atoms/cm$^3$, whereas the impurity concentration of the p+ type punch-through preventing region 6 is set at about $1\times10^{17}$ atoms/cm$^3$.

As explained above, according to the second embodiment, the photodiode signal accumulating region having a low impurity concentration can be stably formed. In addition, even if the MOS transistor is miniaturized, punch-through can be prevented.

Embodiment 3

The characteristic feature of the MOS type solid-state imager according to this embodiment resides in the p+ type punch-through preventing region 6.

In the aforementioned two embodiments, the $p^+$ type punch-through preventing region 6 is also formed immediately under the n-type first semiconductor region 4 at a drain side of the read gate (MOS transistor of the element region A).

In contrast, the $p^+$ type punch-through preventing region 6 of this embodiment is not only formed immediately under the n-type first semiconductor region 4 but also formed so as to over a part of the channel immediately under the read gate electrode 8.

The $p^+$ type punch-through preventing region 6 is formed immediately under the n-type first semiconductor region 4 and over a part of the channel of the read gate electrode 8 only by modifying a mask pattern at the time of ion implantation.

Now, a third embodiment of the MOS type solid-state imager will be explained below.

FIG. 4 shows the third example of the MOS type solid-state imager.

A p-type semiconductor substrate 1 contains an impurity as low as a $1\times10^{15}$ atoms/cm$^3$. The semiconductor substrate 1 serves as an anode of a photodiode. The semiconductor substrate 1 is set at, for example, a ground potential. Meantime, in the case where a p-type well region is formed in the semiconductor substrate 1, the p-type well region may be used as the anode of the photodiode. In this case, the impurity concentration of the p-type well region is set at $1\times10^{15}$ atoms/cm$^3$.

On the semiconductor substrate 1, an insulting layer 10 is formed for electrically separating elements. In this example, the insulative isolation layer 10 is a field oxide film formed by a LOCOS (Local Oxidation Silicon) method. Alternatively, an oxide film formed by, for example, a STI method, may be used in place of the field oxide film.

An element region A surrounded by the insulative isolation layer 10 is the region in which the photodiode 21 and the read gate 22 (shown in FIG. 1) are to be formed. Furthermore, in an element region B surrounded by the insulative isolation layer 10, elements such as the reset gate 23, the sense gate 24, the select gate 25 (shown in FIG. 1) except the photodiode 21 and read gate 22, are to be formed.

In the element region A, an n-type signal accumulating region 2 is formed inside the semiconductor substrate 1. In this embodiment, the n-type signal accumulating region 2 is not formed within the $p^+$ type punch-through preventing region 6 but directly formed within the semiconductor substrate 1. Within the n-type signal accumulating region 2, a $P^{++}$ type surface shield layer 3 is formed.

Furthermore, in the element region A, the $p^+$ type punch-through preventing region 6 is formed inside the semiconductor substrate 1 at a portion sufficiently deep from the surface and different from the portion where the n-type signal accumulating region 2 is formed. Within the $p^+$ type punch-through preventing region 6, an n-type first semiconductor region 4 is formed.

On the p-type read out channel region 9 between the n-type signal accumulating region 2 and the n-type first semiconductor region 4, a read gate electrode 8 is formed via a gate oxide film 7 formed of SiO$_2$. The read gate electrode 8 is formed of a conductive polysilicon film containing an n-type impurity and serves as a gate electrode of a read gate (MOS transistor) 22 of FIG. 1.

In the element region B, the $p^+$ type punch-through preventing region 6 is formed inside the semiconductor substrate 1 for preventing punch-through. The $p^+$ type punch-through preventing region 6 is formed over the entire element region B. Within the $p^+$ type punch-through preventing region 6, an n-type second semiconductor region 11 and an n-type third semiconductor region 12 are formed.

On the p-type channel region 13 between the n-type second semiconductor region 11 and the n-type third semiconductor region 12, a gate electrode 14 is formed via a gate oxide film 7 formed of SiO$_2$. The gate electrode 14 is formed of a conductive polysilicon film containing, for example, an n-type impurity. The gate electrode 14 serves as a gate electrode of a MOS transistor, such as the reset gate 23, the sense gate 24, or the select gate 25 shown in FIG. 1.

Like the first and second embodiments, also in the device of the MOS type solid-state imager of this embodiment, the $p^+$ type punch-through preventing region 6 is not formed immediately under the n$^-$ signal accumulating region 2. More specifically, in the present invention, the n-type signal accumulating region 2 is directly formed inside the semiconductor substrate 1 and not formed within the $p^+$ type punch-through preventing region 6. Therefore, the n-type signal accumulating region 2 having a low impurity concentration can be stably formed.

More specifically, the impurity (e.g., boron) concentration of the semiconductor substrate 1 is set at $1\times10^{15}$ atoms/cm$^3$. The impurity (boron) concentration of the $p^+$ type punch-through preventing region 6 is set at $1\times10^{17}$ atoms/cm$^3$.

In the present invention, the n-type signal accumulating region 2 is formed within the semiconductor substrate 1 containing an impurity at a concentration lower than that of the $p^+$ type punch-through preventing region 6 by a factor of $10^2$. When impurity ions are implanted to form the n-type signal accumulating region 2, the dose of the n-type impurity can be set low. As a result, the n-type signal accumulating region 2 having a low impurity concentration can be stably formed.

Note that it is necessary to form the $p^+$-type punch-through preventing region 6 immediately under the insulative isolation layer 10, with certainty, in order to efficiently prevent punch-through of two n-type signal accumulating regions 2 sandwiching the insulative isolation layer 10.

The $p^+$ type punch-through preventing region 6 is formed by implanting impurity ions at a predetermined dose while applying a predetermined acceleration energy after the insulative isolation layer 10 is formed before the gate electrodes 8 and 14 are formed. At that time, if impurity ions are doped under such a condition that the impurity ions (e.g., boron) penetrate through the insulative isolation layer 10, the impurity ions reach a portion deep within the semiconductor substrate 1 of the element region having no insulative isolation layer 10, as shown in FIG. 4. As a result, the $p^+$ type punch-through preventing region 6 is formed at a position sufficiently deep from the surface of the semiconductor substrate 1.

In FIG. 4, the thickness of the gate oxide film 7 is set at about 8 nm and the gate length (channel length) of the gate electrode 14 is set at about 0.4 µm. The impurity concentration of the $p^{++}$ type surface shield layer 3 is set at about $1\times10^{18}$ atoms/cm$^3$, whereas the impurity concentrations of both the $p^+$ type punch-through stopper 5 and the $p^+$ type punch-through preventing region 6 are set at about $1\times10^{17}$ atoms/cm$^3$.

As explained above, according to the third embodiment, the photodiode signal accumulating region having a low impurity concentration can be stably formed. In addition, even if the MOS transistor is miniaturized, punch-through can be prevented.

Explanation of the Manufacturing Method

Now, a method of manufacturing the MOS type solid-state imager of the present invention will be described.

The manufacturing method explained below is applicable to all devices of the first to third embodiments mentioned above. Note that a specific step(s) to individual embodiments will be explained separately in each of the embodiments.

First, as shown in FIG. 5, an insulative isolation layer 10 is formed on a p-type semiconductor substrate 1 by the LOCOS method. Thereafter, a buffer oxide film 15 is formed on the element regions A and B surrounded by the insulative isolation layer 10.

Subsequently, as shown in FIG. 6, channel ions are implanted into the element region A for determining the threshold of a MOS transistor, thereby forming a p-type readout channel region 9. Similarly, channel ions are implanted into the element region B for determining the threshold of the MOS transistor, thereby forming a p-type channel region 13.

In this embodiment, both channel regions 9 and 13 are formed by two ion implantation steps. In this case, two steps of PEP (Photo Engraving Process) are required to form both channel regions 9 and 13. When the yields of the MOS transistors formed in the element regions A and B are set at the same value, both channel regions 9 and 13 are formed in a single ion implantation step. A single PEP is only performed to form both channel regions 9 and 13, herein.

Thereafter, a resist layer 16 is formed. A resist pattern (resist layer 16) serving as a mask is left on the element region A by performing PEP.

According to the method of forming the imager according to the first embodiment, the resist layer 16 is formed so as to cover the entire element region A of the resist layer 16. According to the second and third embodiments, the resist layer 16 is not formed at a part of the element region A.

Subsequently, p-type impurity ions (e.g., boron) are doped by an ion implantation method with the resist layer 16 as a mask. As a result, a $p^+$ type punch-through preventing region 6 is formed inside the semiconductor substrate 1.

At that time, an acceleration energy is controlled such that the $p^+$ type punch-through preventing region 6 is formed at a depth of 0.2–0.4 $\mu$m from the surface of the semiconductor substrate 1. In addition, the acceleration energy is also controlled such that the $p^+$ punch-through preventing region 6 is also formed immediately under the insulative isolation layer 10.

Furthermore, the dose amount is controlled such that an impurity concentration of the $p^+$ type punch-through preventing region 6 is about $1 \times 10^{17}$ atoms/cm$^3$. In this embodiment, a single implantation step is usually performed to form the $p^+$ punch-through preventing region 6. However, the ion implantation step for forming the $p^+$ punch-through preventing region 6 may be performed twice.

Now, specific conditions for forming a device in practice will be explained.

To form the $p^+$ punch-through preventing region 6, the resist layer 16 is actually formed in a size smaller than that of the element region A for the reason explained below. When the $p^+$ punch-through preventing region 6 is formed around the element region A, if the region 6 is formed so as to slightly break into the element region A, the depletion layer of a photodiode is prevented from reaching the defect formed in the insulative isolation layer 10.

Assuming that the $p^+$ punch-through preventing region 6 breaks into the element region A by a width X, the width X is preferably set at the alignment tolerance or more, taking the misalignment of a mask (resist layer 16) into consideration. The width X is set at, for example, about 0.2 $\mu$m or more.

Thereafter, the buffer oxide film 15 on the element region B is removed. Subsequently, a gate oxide film 7 of 10 nm or less, e.g., about 8 nm, is formed on the element region B by a thermal oxidation method. Thereafter, the resist layer 16 on the element region A is removed, and then, the buffer oxide film 15 on the element region A is removed.

As a next step, as shown in FIG. 7, a gate oxide film 7 of 10 nm or less, e.g., about 8 nm thick is formed on the element region A by a thermal oxidation method.

In this embodiment, the gate oxide film 7 is formed on the element region A and on the element region B in different steps; however, may be formed in the same step. In this case, after the resist layer 16 (FIG. 6) is removed, the buffer oxide film 15 is removed simultaneously from both element regions A and B, and then, the gate oxide film 7 is simultaneously formed on both the element regions A and B.

After a conductive polysilicon film containing an impurity is formed and a resist layer is formed, the resultant construction is subjected to PEP and RIE steps. In this manner, a read gate electrode 8 is formed on the gate oxide film 7 of the element region A and a gate electrode 14 is formed on the gate oxide film 7 of the element region B.

Alternatively, when the oxide film (or nitride film) is formed and then the resultant structure is subjected to RIE, side wall (spacer) is formed on the sides of the gate electrodes 8 and 14.

Thereafter, a resist coating step and a PEP step are performed in accordance with the method of manufacturing the device of the first embodiment mentioned above, a resist pattern (resist layer 17) having an opening in a part of the element region A is formed, as shown in FIG. 7. As a next step, ion implantation is performed with the resist layer 17 as a mask. Through this step, a p-type impurity (e.g., boron) is doped in the semiconductor substrate 1, thereby forming a $p^+$ type punch-through stopper 5.

Thereafter, the resist layer 17 is removed.

In the methods of manufacturing a device according to second and third embodiments, a step of forming the $p^+$ type punch-through stopper 5 is not needed.

Figures 8, 9:
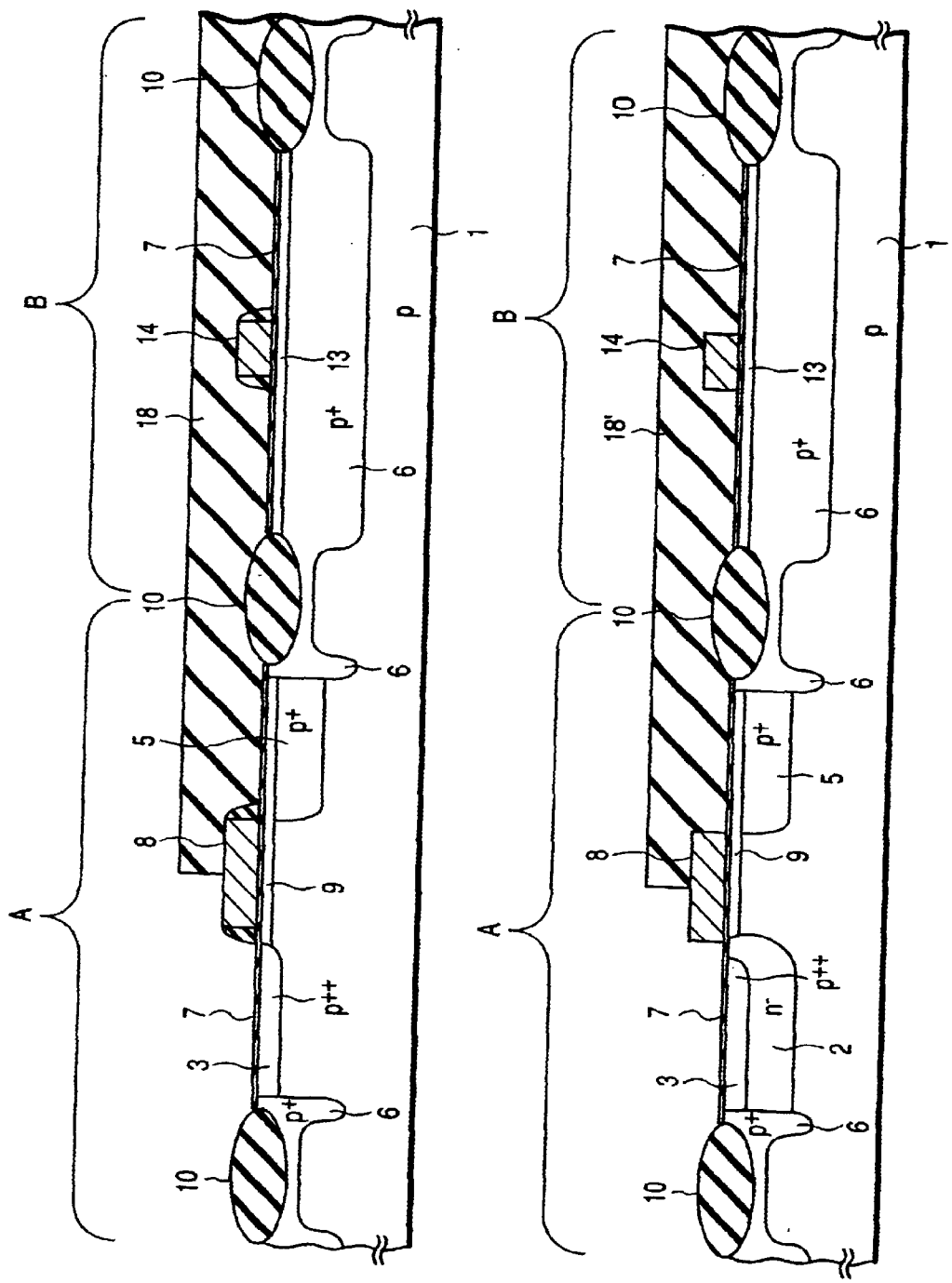
FIG. 8 is a cross-sectional view showing a step of a method of manufacturing a MOS type solid-state imager of the present invention.
FIG. 9 is a cross-sectional view showing a step of a method of manufacturing a MOS type solid-state imager of the present invention.

Subsequently, resist coating and PEP are performed to form a resist pattern (resist layer 18) having an opening corresponding to a photodiode formation region on the element region A, as shown in FIG. 8. Thereafter, ion implantation is performed with the resist layer 18 and the side walls of the gate electrodes 8 and 14 as a mask. In this manner, a p-type impurity (e.g., B) is doped in the semiconductor substrate 1, thereby forming a $p^{++}$ type surface shield layer 3.

After that, the resist layer 18 is removed, and then, the side walls of the gate electrodes 8 and 14 are removed, as shown in FIG. 9. Again, a resist coating and PEP are performed to form a resist pattern (resist layer 18') having an opening corresponding to the photodiode formation region on the element region A. Thereafter, ion implantation is performed with the resist layer 18' as a mask, thereby doping an n-type impurity (phosphorus) in the semiconductor substrate 1. As a result, an n-type signal accumulating region 2 is formed.

The resist layer 18' is thereafter removed.

Figure 10:
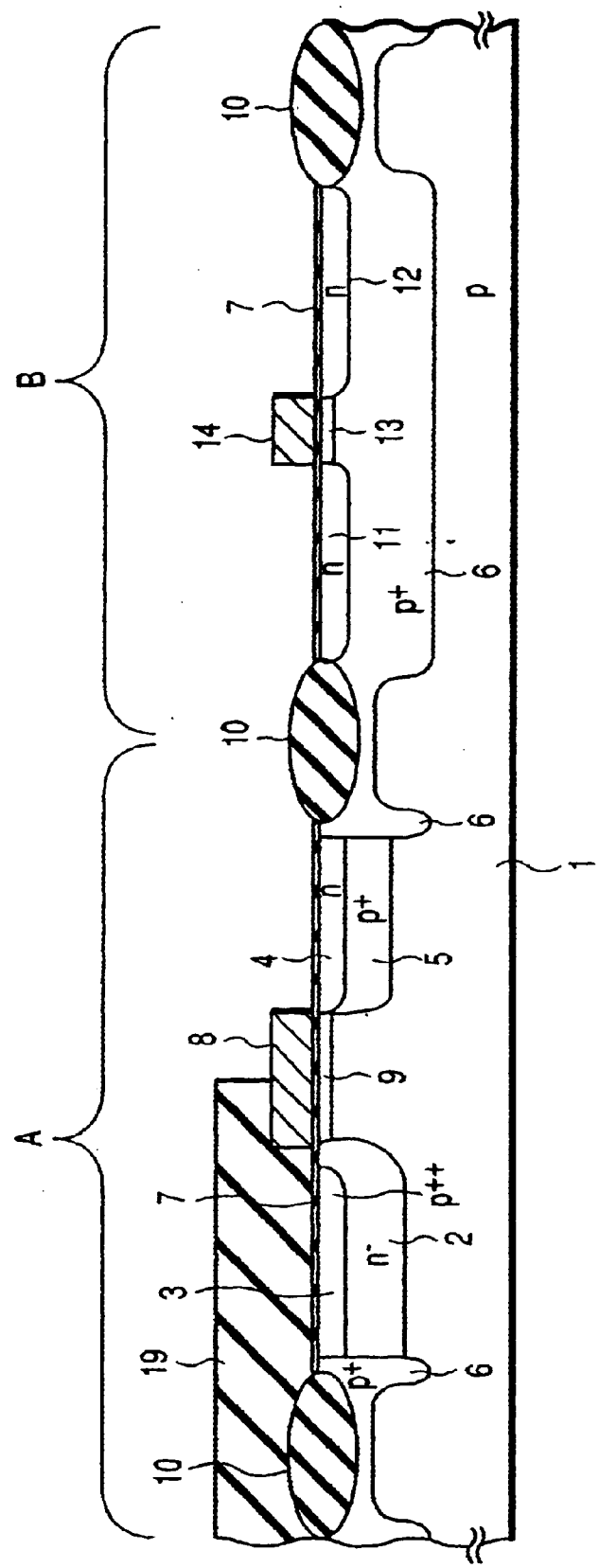
FIG. 10 is a cross-sectional view showing a step of a method of manufacturing a MOS type solid-state imager of the present invention.

Finally, resist coating and PEP are performed to from a resist pattern (resist layer 19) having openings on a part of the element region A and the element region B, as shown in FIG. 10. Thereafter, ion implantation is performed with the resist layer 19 and the gate electrodes 9 and 14 as a mask, thereby doping an n-type impurity (e.g., phosphorus) in the semiconductor substrate 1. As a result, n-type first to third semiconductor regions 4, 11, and 12 are formed.

The resist layer 19 is thereafter removed.

Note that the wiring step and passivation steps are performed after this, however, detail explanation for these steps are omitted herein.

The MOS type solid-state imager according to the present invention is accomplished by the method mentioned above.

In the first embodiment of the MOS type solid-state imager, the p$^+$ type punch-through stopper 5 may not be formed. If this step (refer to the description regarding the manufacturing method) is omitted, the manufacturing cost can be reduced. In addition, it is not always necessary to follow the manufacturing steps according to the second and third embodiments. In this case, if the p$^+$ type punch-through preventing region 6 is allowed to break into the element region A by the predetermined width X (see FIG. 6), the punch-through preventing effect can be sufficiently obtained in the MOS transistor formed in the element region A.

The first to third embodiments may be modified as follows. The p$^+$ type punch-through preventing region 6 may be formed by implanting a p-type impurity by using the same mask which has been used in the ion implantation step for determining the threshold of the MOS transistor. This modification may be applied to the case where ions are not implanted to the channel region of a read gate (MOS transistor) in the element region A.

In the first to third embodiments, the cases where an n-channel MOS transistor is formed in the p-type semiconductor substrate have been explained. However, the present invention is applicable to the case where a p-type channel MOS transistor is formed in an n-type semiconductor substrate.

According to the MOS type solid-state imager and the method of manufacturing the same, the p$^+$ -type punch-through preventing region is not formed immediately under the photodiode single accumulating region. On the other hand, the p$^+$ type punch-through preventing region is formed so as to break into the element region where the read gate (MOS transistor) is to be formed (the source of the read gate serves as a signal accumulating region of a photodiode) by at least a predetermined width and so as to extend the entire element region excluding the aforementioned element region where the read gate is to be formed.

Therefore, even though the gate length of the MOS transistor is reduced and the thickness of the gate oxide film is reduced, it is possible to prevent not only punch-through of the MOS transistor but also punch-through between elements (two elements sandwiching the insulating layer). In addition, since the signal accumulating region of the photodiode is not formed by doping impurity ions of the opposite conductive type of that of the p$^+$ type punch-through preventing region, the depletion potential of the photodiode formed in a picture element can be stabilized at a low level.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS type solid-state imager comprising:

a photoelectric conversion element formed in a semiconductor substrate of a first conductive type;

a first MOS transistor of a second conductive type formed in a first element region of the semiconductor substrate for reading out a charge generated by the photoelectric conversion element;

a second MOS transistor of the second conductive type formed in a second element region of the semiconductor substrate;

an insulative isolation layer surrounding the first and second element regions; and a punch-through preventing region of the first conductive type for preventing punch-through, said punch-through preventing region being formed in a surface area of the second element region as well as being formed immediately under the insulative isolation layer, wherein a bottom surface of the punch-through preventing region of the second element region is deeper than a bottom surface of the punch-through preventing region formed immediately under the insulative isolation layer.

2. The MOS type solid-state imager according to claim 1, wherein said punch-through preventing region is formed in a peripheral portion of the first element region along the insulative isolation layer.

3. The MOS type solid-state imager according to claim 2, wherein a width between the insulative isolation layer and an end of the punch-through preventing region within the first element region is decided based on the alignment tolerance of a mask material to be used in forming the punch-through preventing region.

4. The MOS type solid-state imager according to claim 3, wherein said width is 0.2 μm or more.

5. The MOS type solid-state imager according to claim 1, wherein said MOS type solid-state imager has a plurality of picture elements, each picture element has the photoelectric conversion element and the first MOS transistor and the second MOS transistor.

6. The MOS type solid-state imager according to claim 1, wherein said photoelectric conversion element is formed in the first element region and a source of the first MOS transistor is an signal accumulating region of the second conductive type of the photoelectric conversion element.

7. The MOS type solid-state imager according to claim 6, further comprising:

a punch-through stopper of the first conductive type formed immediately under a drain of the first MOS transistor.

8. The MOS type solid-state imager according to claim 6, wherein said punch-through preventing region is formed immediately under the drain of the first MOS transistor.

9. The MOS type solid-state imager according to claim 6, wherein said punch-through preventing region covers over the drain of the first MOS transistor and a part of a channel.

10. The MOS type solid-state imager according to claim 6, wherein said photoelectric conversion element is constituted of the semiconductor substrate and the signal accumulating region, and the punch-through preventing region is not formed immediately under the signal accumulating region.

11. The MOS type solid-state imager according to claim 10, wherein said punch-through preventing region is formed next to the signal accumulating region.

12. The MOS type solid-state imager according to claim 1, wherein a depth of the punch-through preventing region of the second element region is set at between 0.2 μm or more and 0.4 μm or less.

13. The MOS type solid-state imager according to claim 1, wherein gate lengths of the first and second MOS transistors are set at 0.4 μm or less and a thickness of the gate oxide film is set at 10 nm or less.

14. A MOS type solid-state imager comprising:

a photoelectric conversion element formed in a semiconductor substrate of a first conductive type;

a first MOS transistor of a second conductive type formed in a first element region of the semiconductor substrate for reading out a charge generated by the photoelectric conversion element;

a second MOS transistor of the second conductive type formed in a second element region of the semiconductor substrate; and a punch-through preventing region of the first conductive type formed in a surface area of the second element region for preventing punch-through, wherein a depth of the punch-through preventing region of the second element region is set at between 0.2 $\mu$m or more and 0.4 $\mu$m or less.

* * * * *